(12) United States Patent
Ellis-Monaghan et al.

(10) Patent No.: US 8,993,428 B2
(45) Date of Patent: Mar. 31, 2015

(54) STRUCTURE AND METHOD TO CREATE A DAMASCENE LOCAL INTERCONNECT DURING METAL GATE DEPOSITION

(75) Inventors: John J. Ellis-Monaghan, Grand Isle, VT (US); Jeffrey P. Gambino, Westford, VT (US); Kirk D. Peterson, Jericho, VT (US); Jed H. Rankin, South Burlington, VT (US); Robert R. Robison, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 853 days.

(21) Appl. No.: 12/573,188

(22) Filed: Oct. 5, 2009

(65) Prior Publication Data

US 2011/0079827 A1    Apr. 7, 2011

(51) Int. Cl.
| | |
|---|---|
| *H01L 21/3205* | (2006.01) |
| *H01L 21/768* | (2006.01) |
| *H01L 29/66* | (2006.01) |
| *H01L 29/51* | (2006.01) |
| *H01L 27/12* | (2006.01) |

(52) U.S. Cl.
CPC .... *H01L 21/76895* (2013.01); *H01L 21/76816* (2013.01); *H01L 29/66545* (2013.01); *H01L 29/517* (2013.01); *H01L 27/1248* (2013.01)
USPC .......................................................... 438/586

(58) Field of Classification Search
USPC .......................................... 438/586, 183, 259
See application file for complete search history.

(56) References Cited

U.S. PATENT DOCUMENTS

| | | | |
|---|---|---|---|
| 5,077,228 A | 12/1991 | Eklund et al. | |
| 6,388,294 B1 | 5/2002 | Radens et al. | |
| 6,406,950 B1 * | 6/2002 | Dakshina-Murthy | 438/183 |
| 6,544,827 B2 * | 4/2003 | Abiko | 438/183 |
| 6,580,137 B2 | 6/2003 | Parke | |
| 6,686,630 B2 | 2/2004 | Hanafi et al. | |
| 6,812,574 B2 | 11/2004 | Tomita et al. | |
| 7,071,529 B2 | 7/2006 | Miyagawa et al. | |
| 7,138,308 B2 * | 11/2006 | Cheng et al. | 438/197 |
| 7,214,972 B2 | 5/2007 | Hanafi et al. | |
| 7,601,592 B2 * | 10/2009 | Oh et al. | 438/259 |
| 7,955,917 B2 * | 6/2011 | Hanafi | 438/183 |
| 2003/0036240 A1 * | 2/2003 | Trivedi | 438/383 |
| 2005/0083756 A1 | 4/2005 | Tomita et al. | |
| 2005/0224886 A1 * | 10/2005 | Doyle et al. | 257/368 |

* cited by examiner

*Primary Examiner* — Fernando L Toledo
*Assistant Examiner* — Neil Prasad
(74) *Attorney, Agent, or Firm* — David Cain; Roberts Mlotkowski Safran & Cole, P.C.

(57) ABSTRACT

A method and structure to create damascene local interconnect during metal gate deposition. A method includes: forming a gate dielectric on an upper surface of a substrate; forming a mandrel on the gate dielectric; forming an interlevel dielectric (ILD) layer on a same level as the mandrel; forming a trench in the ILD layer; removing the mandrel; and forming a metal layer on the gate dielectric and in the trench.

27 Claims, 6 Drawing Sheets

STRUCTURE AND METHOD TO CREATE A DAMASCENE LOCAL INTERCONNECT DURING METAL GATE DEPOSITION

FIELD OF THE INVENTION

The invention generally relates to the fabrication of semiconductor circuit chips and, more particularly, to a structure and method to create a damascene local interconnect during metal gate deposition.

BACKGROUND

Semiconductor device manufacturers are migrating toward the use of high dielectric constant (e.g., high-k) gate dielectric, instead of the commonly used gate oxide. Metal gates, instead of polysilicon gates, are typically used to obtain the maximum benefit of using a high-k gate dielectric since a metal gate permits a better optimization of the work function between the gate, gate dielectric, and substrate. Many integration schemes use a damascene replacement gate process to form such metal gates.

For example, a damascene gate is commonly formed by first depositing a high-k gate dielectric on a substrate, depositing polysilicon on the gate dielectric, and patterning the polysilicon into a dummy gate (e.g., mandrel). Any desired spacers, implants (e.g., source, drain, halo, etc.), silicides, etc., are formed before an interlevel dielectric layer (ILD) is formed over the top of the structure. The ILD is then recessed down to the top of the polysilicon and the polysilicon dummy gate is stripped away, leaving a gate trench in the ILD. Metal is then deposited into the gate trench, resulting in a metal gate formed on a high-k gate dielectric.

Local interconnects are known in the industry for providing electrical connections to one or more gates. Local interconnects typically consist of a metalized wire formed in an ILD level above the ILD level of the gate, and vertical metal connections formed between the wire and the gate. Owing to this geometry, conventional local interconnects, or other wiring techniques through traditional wiring channels, have a relatively long circuit path and occupy a large amount of area within an integrated circuit (IC). Moreover, because conventional local interconnects are formed in additional wiring levels after the gates are formed, the formation of such local interconnects adds numerous processing steps to the semiconductor device fabrication. The additional processing steps necessarily increase the time and cost of fabrication.

Accordingly, there exists a need in the art to overcome the deficiencies and limitations described hereinabove.

SUMMARY

In a first aspect of the invention, there is a method of forming a semiconductor structure. The method includes: forming a gate dielectric on an upper surface of a substrate; forming a mandrel on the gate dielectric; forming an interlevel dielectric (ILD) layer on a same level as the mandrel; forming a trench in the ILD layer; removing the mandrel; and forming a metal layer on the gate dielectric and in the trench.

In another aspect of the invention, there is a method for forming a semiconductor structure. The method includes: forming at least one trench in a dielectric layer containing at least one dummy gate; exposing a gate dielectric by removing the at least one dummy gate; and substantially simultaneously forming a damascene gate on the gate dielectric and a local interconnect in the trench.

In another aspect of the invention, there is a structure comprising a gate on a gate dielectric and a local interconnect. the gate and the local interconnect are in a same layer of dielectric material, and the gate and the local interconnect are composed of a same metal layer.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention generally relates to the fabrication of semiconductor circuit chips and, more particularly, to a structure and method to create a damascene local interconnect during metal gate deposition. In accordance with aspects of the invention, a local interconnect is formed in the same wiring level as a damascene gate at substantially the same time as the damascene gate. In embodiments, a trench for a local interconnect is patterned in the wiring level of the damascene gate before the metal of the damascene gate is deposited. Metal forming both the damascene gate and the local interconnect is then deposited in a single processing step, and subsequently planarized. In this manner, a local interconnect may be formed simultaneously with a damascene gate and in the same topological level as the damascene gate.

Figure 1:
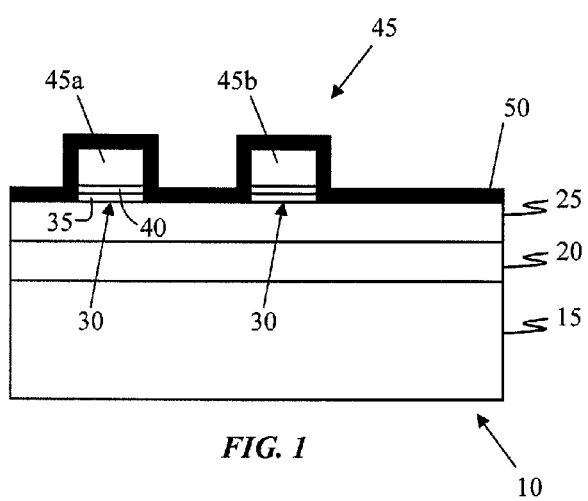
FIGS. 1-20 show views of structures and respective processing steps in accordance with aspects of the invention.
Figure 2:
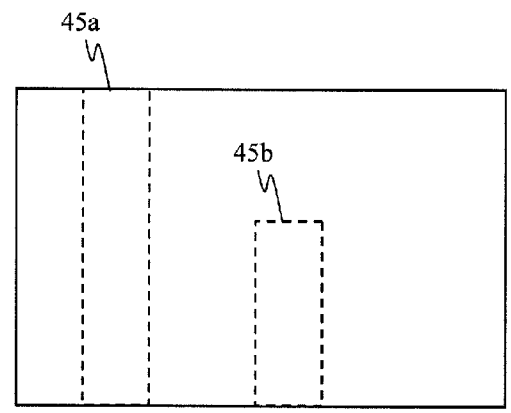

FIGS. 1-20 show views of structures and respective processing steps in accordance with aspects of the invention. For example, FIG. 1 shows a cross-section view of a semiconductor structure and FIG. 2 depicts a top view of the structure of FIG. 1. More specifically, FIG. 1 shows a substrate 10 comprising a silicon-on-insulator (SOI) structure including a wafer 15, an insulator 20 formed on the wafer 15, and a silicon-containing layer 25 formed on the insulator 20.

A high-k gate dielectric 30 is formed on portions of the substrate 10. In embodiments, the high-k gate dielectric 30 comprises a hafnium oxide layer 35 formed on the silicon-containing layer 25, and a gate metal layer 40, such as titanium or tungsten, formed on the hafnium oxide layer 35. The hafnium oxide layer 35 may have a depth (e.g., thickness) of about 15 to 20 Angstroms, and the gate metal layer 40 may have depth of about 100 to 200 Angstroms. In embodiments, the high-k gate dielectric 30 has a dielectric constant value of about 17.0 or greater. However, the invention is not limited to this particular arrangement of high-k gate dielectric, and any suitable material or layers of materials may be used as the high-k gate dielectric in accordance with aspects of the invention. Moreover, the high-k gate dielectric 30 may be formed using conventional deposition process such as, for example, chemical vapor deposition (CVD) or plasma-assisted CVD, or a thermal growing process such as oxidation, nitridation or oxynitridation.

Still referring to FIG. 1, at least one polysilicon gate 45 (also referred to as a dummy gate and/or a mandrel) is formed atop the gate dielectric 30, and a barrier nitride layer 50 is conformally deposited over the entire structure. For example, a first polysilicon gate 45a and a second polysilicon gate 45b are depicted for exemplary purposes, but any number of gates 45, including as few as one, can be used within the scope of the invention. Moreover, the gates 45a, 45b may have any desired location and geometry, e.g., size and shape and can be formed using conventional processes, such as conventional deposition, lithography, and etching. For example, as depicted in FIG. 2, the first gate 45a may extend the entire length of the substrate 10, while the second gate runs for only a portion of the length of the substrate 10.

The features shown in FIG. 1 may be formed using conventional semiconductor fabrication techniques. Also, although not shown, any suitable transistor features, such as spacers, implants (e.g., source, drain, halo, etc.), silicides, etc., may be formed with the structure of FIG. 1 using conventional semiconductor fabrication techniques. Moreover, implementations of the invention are not limited to use with an SOI wafer. Instead, embodiments of the invention may be implemented with any suitable substrate, including but not limited to: Si, SiGe, SiC, SiGeC, and layered semiconductors such as Si/SiGe, and SiGe-on-insulator (SGOI).

Figure 3:
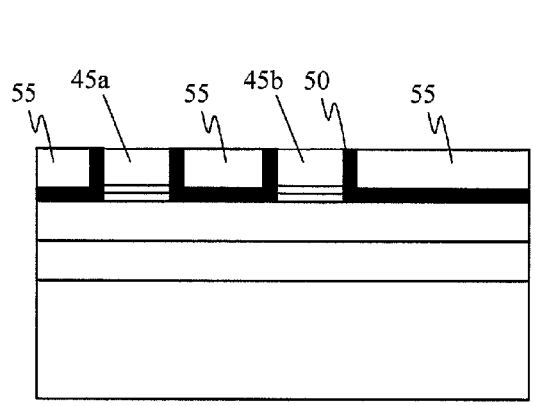
Figure 4:
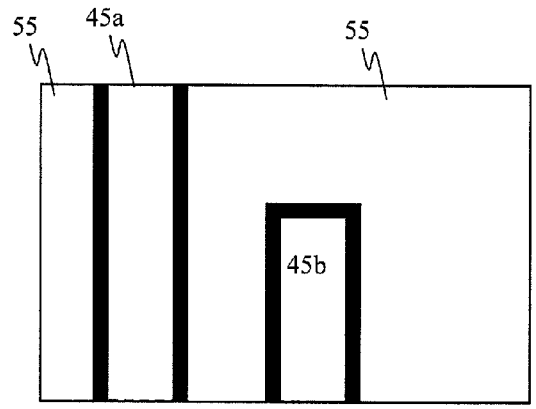

As depicted in FIGS. 3 and 4, an ILD layer 55 is formed over the barrier nitride layer 50. The ILD layer 55 may comprise any conventional material, e.g., tetraethylorthosilicate (TEOS), borophosphosilicate glass BPSG, etc., formed in any conventional manner, e.g., chemical vapor deposition (CVD), etc. After forming the ILD layer 55, the ILD layer 55 is planarized down to the top of the gates 45a, 45b. The planarization may be performed using any suitable technique, including but not limited to chemical mechanical polishing (CMP). The planarization removes a portion of the barrier nitride layer 50 from the top of the gates 45a, 45b.

Figure 5:
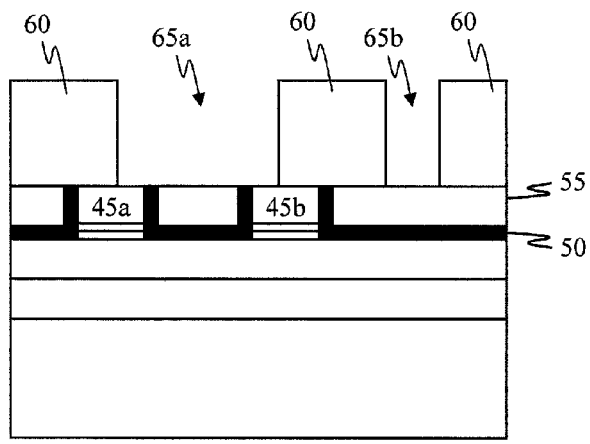
Figure 6:
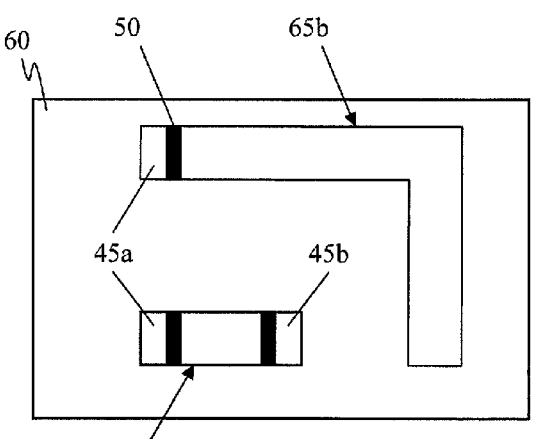

As shown in FIGS. 5 and 6, a photoresist layer 60 is deposited and patterned (e.g., exposed and developed) on the upper surface of the structure. The photoresist layer 60 is deposited and patterned using conventional lithographic materials and etching processes. In embodiments, the pattern formed in the photoresist layer 60 corresponds to at least one local interconnect that will be formed in the ILD layer 55 in accordance with aspects of the invention. For example, as shown in FIG. 5, a first opening 65a and a second opening 65b are patterned in the photoresist layer 60. Particularly, as shown in FIG. 6, the first opening 65a is formed over a portion of the ILD layer 55 between the first and second gates 45a, 45b, and the second opening 65b extends in an "L" shape from another portion of the first gate 45a. The invention is not intended to be limited to the exemplary first and second opening 65a, 65b depicted in FIGS. 5 and 6; rather, one or more openings having any desired shape(s) and any desired spatial location(s) may be used within the scope of the invention.

Figure 7:
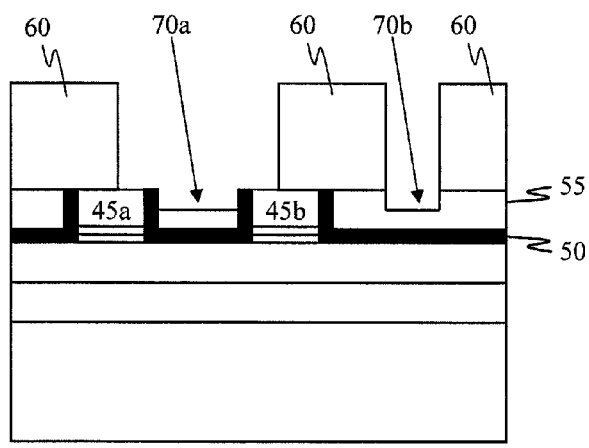
Figure 8:
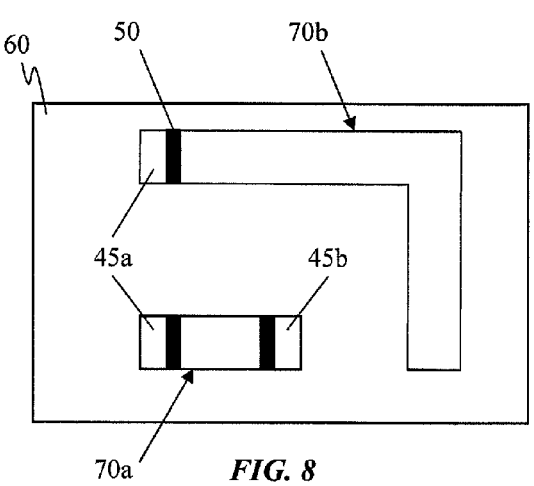

As depicted in FIGS. 7 and 8, one or more portions of the ILD layer 55 is removed using the photoresist layer 60 as a mask. In embodiments, a selective reactive ion etch (RIE) is used to etch the exposed portions of the ILD layer 55 through the openings in the photoresist layer 60. The etching creates trenches, e.g., first trench 70a and second trench 70b, in the ILD layer 55. The etching can be of any desired depth down to the barrier nitride layer 50. For example, as shown in FIG. 7, the etching can remove about half the thickness of the ILD layer 55 in the etch area. However, the invention is not limited to any particular depth, and any desired depth of etching into the ILD layer 55 may be used within the scope of the invention. For example, as deeper etch may be desirable for wires designed to carry higher current. The depth of the etching may be controlled by controlling the timing of the etching. For example, the etch may be performed through the nitride to the silicon to facilitate creation a strap (e.g., interconnect) between a gate and a source and/or drain.

Any suitable RIE process, such as, for example, a fluoride based etch, may be used to etch the exposed portions of the ILD layer 55. Moreover, the invention is not limited to etching. Instead, any desired material removal process may be used to form the trenches in the ILD layer 55. For example, other material removal processes, such as laser ablation, focused ion beam (FIB), etc., may be used within the scope of the invention.

Figure 9:
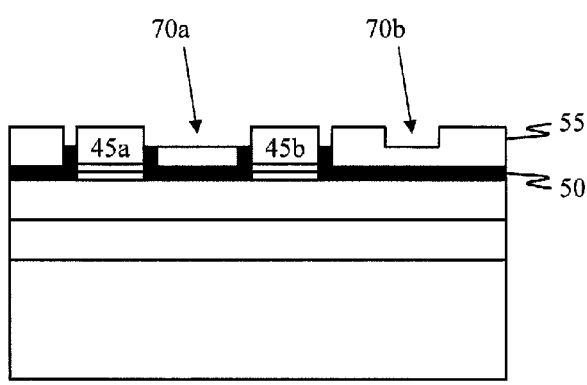
Figure 10:
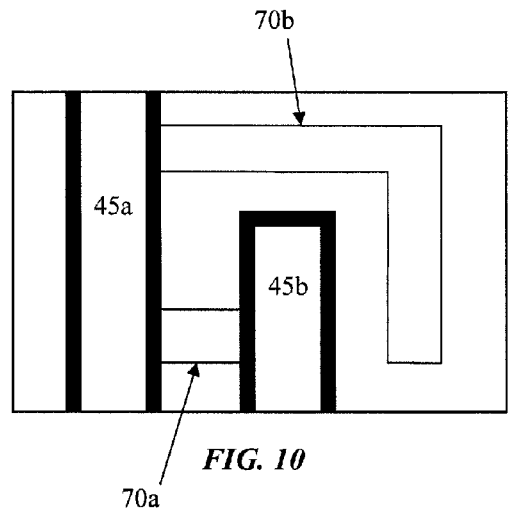

In embodiments, as shown in FIGS. 9 and 10, the photoresist layer is stripped using conventional processes. The exposed portions of the barrier nitride layer 50 are recessed down to substantially the same depth as the etched portions of the ILD layer 55. In embodiments, this recessing of the barrier nitride layer 50 is performed using a second RIE process that is selective to the material of the barrier nitride layer 50.

Figure 11:
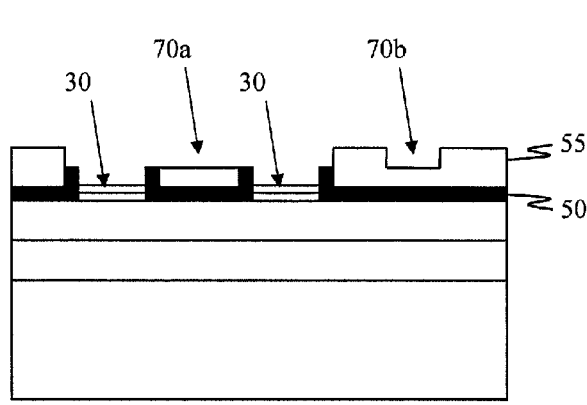
Figure 12:
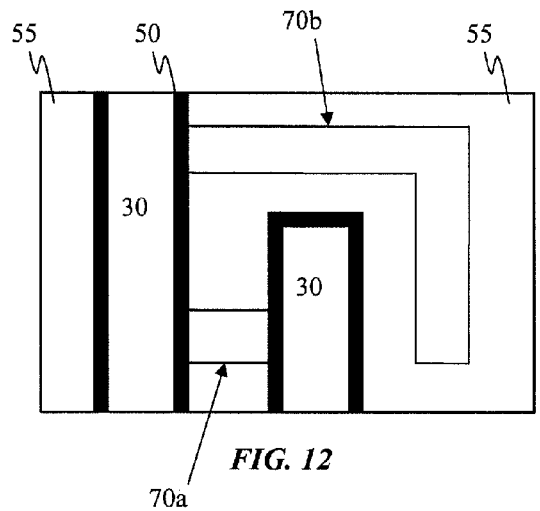

As depicted in FIGS. 11 and 12, the first and second gates 45a, 45b are removed. In embodiments, the polysilicon material of the gates 45a, 45b is stripped using a conventional selective wet etch, such as, for example, a bath of phosphoric acid. The removal of the gates 45a, 45b exposes the gate dielectric 30.

FIGS. 9-12 show the barrier nitride layer 55 being recessed before the stripping of the gates 45a, 45b. However, in accordance with aspects of the invention, the step of recessing the barrier nitride layer may be performed before or after the removal of the gates 45a and 45b. For example, the gates may be stripped after etching the ILD layer and removing the photoresist, and then the exposed barrier nitride may subsequently be etched down to a level substantially equal to that of the etched ILD layer.

Figure 13:
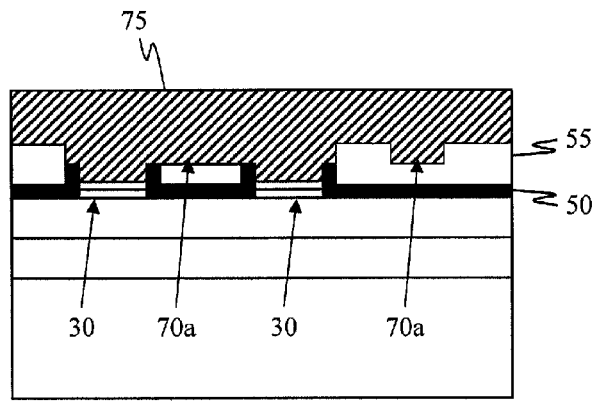
Figure 14:
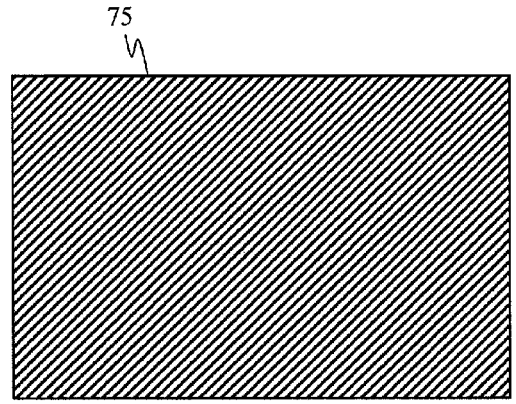

In accordance with aspects of the invention, as depicted in FIGS. 13 and 14, a metal layer 75 is formed on the exposed surfaces of the structure of FIGS. 11 and 12. The metal layer 75 may be formed using conventional processes, such as, for example, CVD (Chemical Vapor Deposition), sputtering, or electro-plating. The metal layer 75 may be composed of any suitable metal-based conductive material, such as, for example: titanium, tungsten, aluminum, aluminum oxide, and copper, alloys, and other metals. In implementations of the invention, the metal layer 75 may be composed of a single substantially homogenous layer of metal, or alternatively can be composed by more than one layer of differing metals. For example, the metal layer 75 may be made up of five different layers of different conductive materials. In embodiments, the metal layer 75 extends at least as high as the uppermost surface of the ILD layer 55, covering the gate oxide 30 and filling the trenches 70a, 70b.

Figure 15:
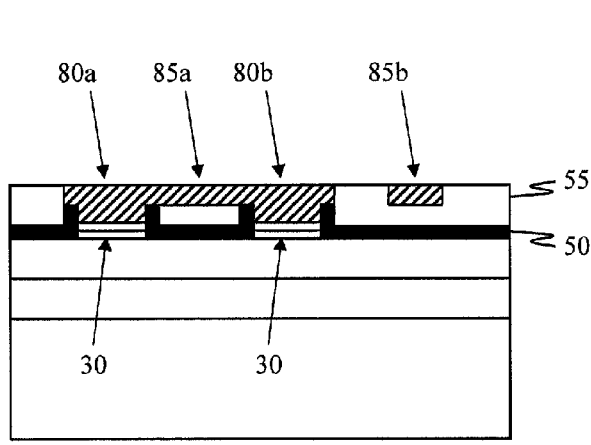
Figure 16:
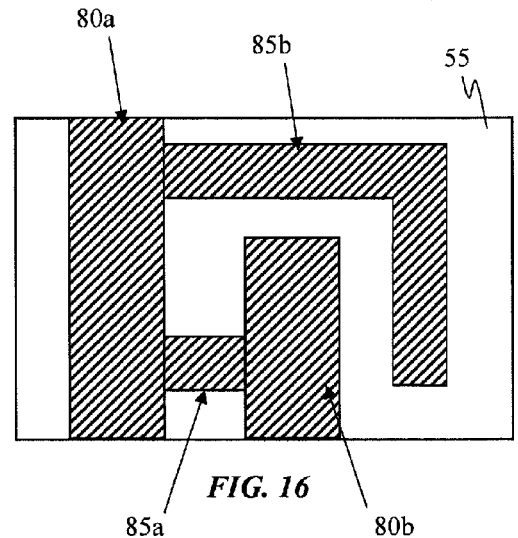

In embodiments, as shown in FIGS. 15 and 16, the top surface of the structure is planarized and excess portions of the metal layer 75 are removed using, for example, another CMP process. The resulting structure comprises at least one metal gate, e.g., first and second metal gates 80a and 80b, formed on (e.g., in direct contact with) the high-k gate dielectric 30, as well as in contact with portions of the ILD layer 55 and/or the nitride layer 50. The resulting structure also includes at least one local interconnect, e.g., first and second local interconnects 85a and 85b, formed in the same ILD layer 55 as the at least one metal gate. The at least one local interconnect may be in direct contact with at least one of: a portion of the ILD layer 55, a portion of the nitride layer 50, and a portion of a metal gate (e.g., 80a, 80b, etc.). Moreover, the at least one metal gate and the at least one local interconnect are formed substantially simultaneously by virtue of both being formed using the same metal fill step, e.g., the deposition of metal layer 75. As already noted herein, the number, location, and geometry of the at least one metal gate and the at least one local interconnect is not critical to the invention. Accordingly, in implementations of the invention, any number of local interconnects having any desired location and geometry may be formed in the same level as, and at the same time as, any number of metal gates having any desired location and geometry.

Figure 17:
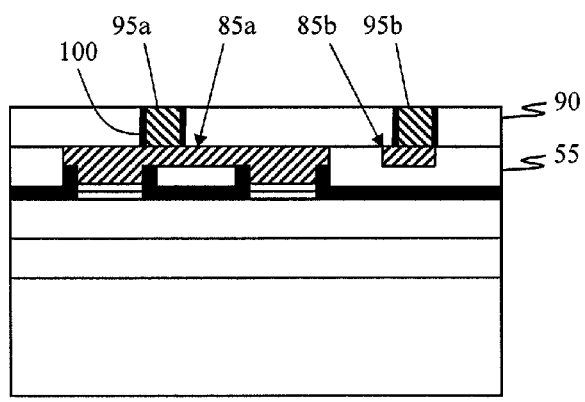
Figure 18:
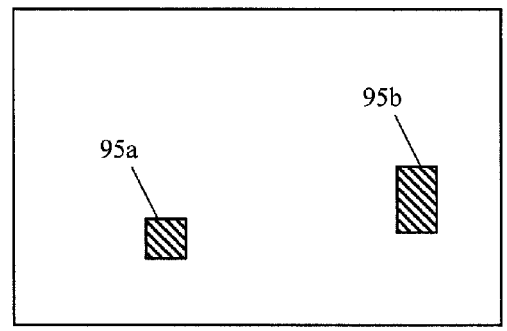

FIGS. 17 and 18 depict an additional ILD layer 90 formed on the first ILD layer 55. Contacts, e.g., first contact 95a and second contact 95b, may be formed in the additional ILD layer 90 using conventional semiconductor fabrication techniques. The first contact 95a is in electrical communication with first local interconnect 85a, and the second contact 95b is in electrical communication with second local interconnect 85b. The contacts 95a, 95b may be composed of any suitable conductor, e.g., tungsten or other metal. Also, any number of contacts and additional wires may be provided in any location in the additional ILD layer 90. Optionally, each contact may be provided with a liner 100 formed using conventional semiconductor fabrication techniques and composed of conventional materials, including but not limited to titanium and titanium-nitride films.

In accordance with aspects of the invention, a contact (e.g., contact 95b) may be formed at a location that is remote from a gate (or other feature) and connected to the gate (or other feature) by one or more local interconnects formed as described herein. For example, as depicted in FIGS. 15-18, contact 95b is located remotely from gate 80a and connected to gate 80a by local interconnect 85b. In this manner, the remote contact 95b forms a landing-pad for a connection to the gate 80a. This can be useful, for example, for optimizing the layout of a semiconductor structure. It is noted that the invention is not intended to be limited to the particular landing-pad example described herein, and that any number of contacts and any number of local interconnects may be provided in any desired configuration in accordance with aspects of the invention.

Figure 19:
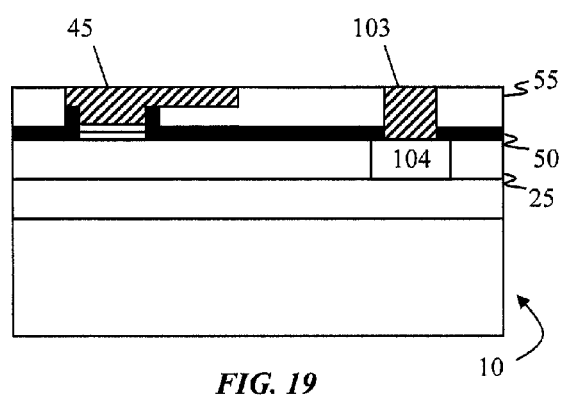

In embodiments, a local interconnect formed in accordance with aspects of the invention may extend through the entirety of the ILD layer and through the nitride barrier layer and into contact with an isolation structure formed in the substrate. For example, as depicted in FIG. 19, a local interconnect 103 formed in accordance with aspects of the invention extends through the ILD layer 55 and the barrier nitride layer 50 and contacts an isolation structure 104 (e.g., a shallow trench isolation (STI) structure) in any portion of the substrate 10, for example, in silicon-containing layer 25. The local interconnect 103 is formed in the same level as a gate 45 and at the same time as the gate 45, in accordance with aspects of the invention. Such a full-height local wire can be formed by adding an additional etching step to etch through the barrier nitride layer 50 after etching the ILD 55, e.g., as described above with respect to FIG. 7. Alternatively, the etch chemistry may be selected such that it is non-selective between the ILD and the barrier nitride.

Figure 20:
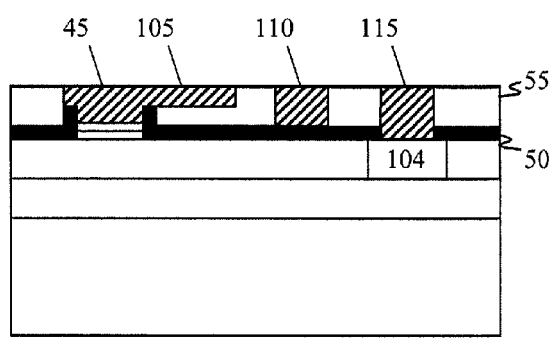

Moreover, different local interconnects having different depths may be etched into the ILD layer and filled simultaneously with a damascene metal gate in a single metal deposition process. For example, as depicted in FIG. 20, a first local interconnect 105 has a depth about halfway into the ILD layer 55, and second local interconnect 110 extends through the ILD layer 55 to the barrier nitride layer 50, and a third local interconnect 115 extends through the ILD layer 55 and the barrier nitride layer 50 and contacts an isolation structure 104 in the substrate 10. The local interconnects 105, 110, 115 are formed in the same level as a gate 45 and at the same time as the gate 45, in accordance with aspects of the invention. Such varied height local interconnects can be formed in accordance with aspects of the invention by using additional lithography levels to define local interconnects having different depths.

Figure 21:
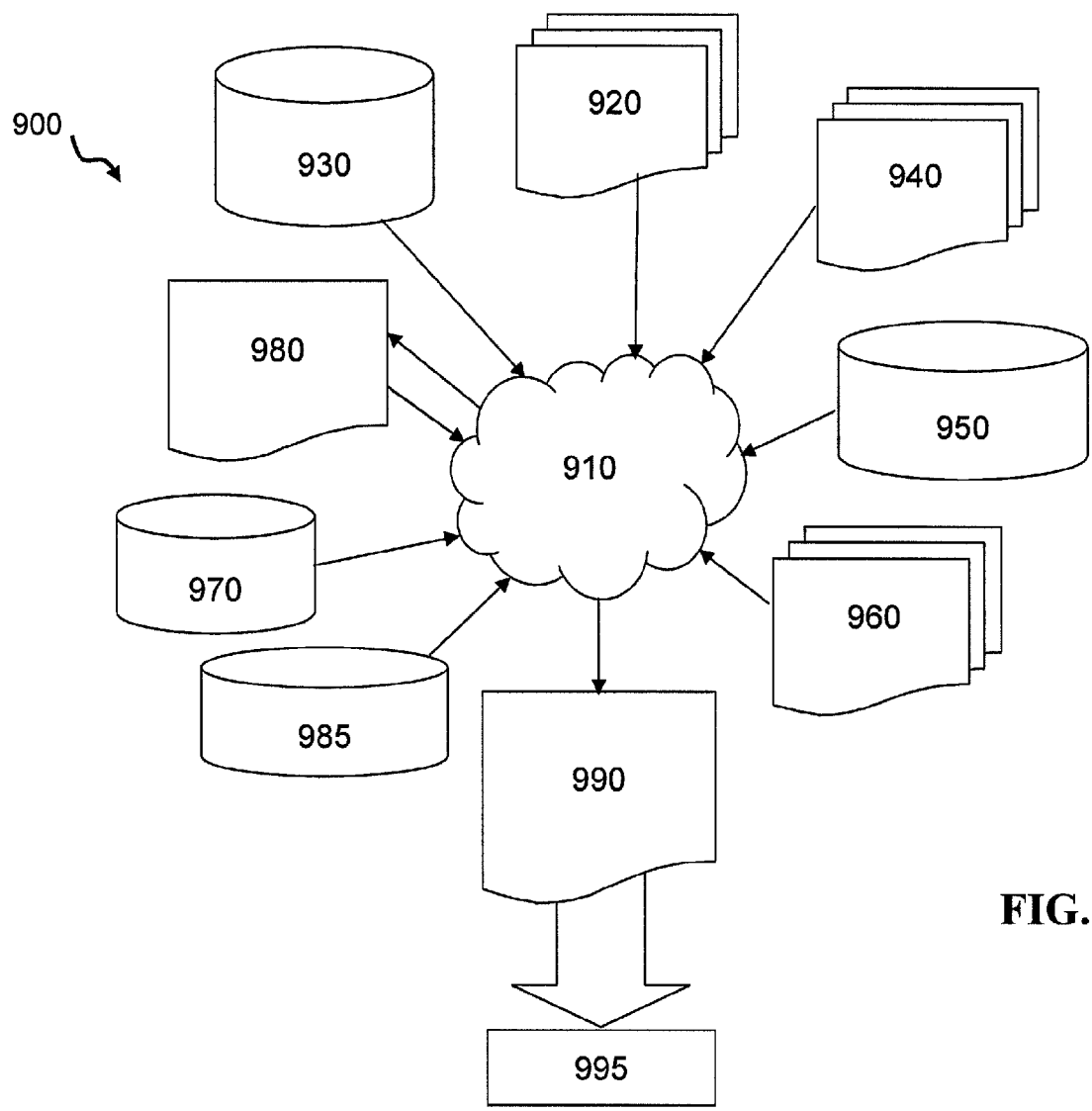
FIG. 21 is a flow diagram of a design process used in semiconductor design, manufacture, and/or test.

FIG. 21 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-20. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 21 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-20. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-20 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-20. In one embodiment, design structure 990 may comprise a compiled, executable HDL simulation model that functionally simulates the devices shown in FIGS. 1-20.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-20. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, where applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method of forming a semiconductor structure, comprising:
   forming a gate dielectric on an upper surface of a substrate;
   forming a mandrel on the gate dielectric;
   forming an interlevel dielectric (ILD) layer on a same level as the mandrel;
   forming a barrier layer between the substrate and the ILD layer;
   forming a trench in the ILD layer;
   removing the mandrel; and
   forming a metal layer on the gate dielectric, which also fills the trench, to substantially simultaneously form a damascene gate on the gate dielectric and a local interconnect in the trench,
   wherein:
   the metal layer is formed directly on an upper surface of the gate dielectric and within the trench;
   at least a portion of the barrier layer is between the damascene gate and the ILD layer;
   the damascene gate contacts the gate dielectric, at least a portion of the ILD layer and the portion of the barrier layer between the damascene gate and the ILD layer; and
   the local interconnect is formed in the ILD layer in direct contact with the portion of the ILD layer, the barrier layer, and the damascene gate.

2. The method of claim 1, wherein the forming the trench in the ILD layer comprises:
   forming a masking layer on the ILD layer;
   forming an opening in the masking layer; and
   etching the trench through the opening.

3. The method of claim 2, wherein:
   the forming the masking layer comprises depositing a photoresist layer;
   the forming the opening in the masking layer comprises patterning the photoresist layer; and
   the etching comprises performing a selective reactive ion etch of the ILD layer through the opening.

4. The method of claim 1, further comprising forming the barrier layer on the substrate, wherein the ILD layer is formed on the barrier layer.

5. The method of claim 4, wherein the forming the barrier layer comprises conformally depositing a nitride layer on exposed portions of the substrate and the mandrel prior to forming the ILD layer.

6. The method of claim 4, further comprising recessing a portion of the barrier layer to substantially a same height as a lower surface of the trench.

7. The method of claim 1, further comprising:
   forming another ILD layer on the ILD layer; and
   forming a contact in the other ILD layer, wherein the local interconnect electrically connects the contact and the damascene gate.

8. The method of claim 1, wherein the trench extends only partially into the ILD layer without extending fully through the ILD layer.

9. The method of claim 1, wherein the trench extends through the ILD layer to one of: the nitride layer, and an isolation structure formed in the substrate.

10. A method of forming a semiconductor structure, comprising:
    forming at least one trench in a dielectric layer containing at least one dummy gate,
    wherein the forming the at least one trench comprises:
    forming a masking layer over the dielectric layer;
    forming a first opening in the masking layer over a portion of the dielectric layer between the at least one dummy gate and at least another dummy gate;
    forming a second opening in the masking layer over another portion of the at least one dummy gate; and
    removing at least one portion of the dielectric layer through the first opening and the second opening;
    exposing a gate dielectric by removing the at least one dummy gate; and
    depositing a metal layer to substantially simultaneously form a damascene gate on the gate dielectric and a local interconnect which fills the at least one trench,
    wherein the metal layer is deposited directly on an upper surface of the gate dielectric and within the at least one trench and forms the local interconnect which is connected to the damascene gate.

11. The method of claim 10, wherein the removing the at least one portion of the dielectric layer through the first opening and the second opening is performed prior to the removing the at least one dummy gate.

12. The method of claim 10, further comprising:
    forming a nitride layer on a sidewall of the at least one dummy gate, wherein the nitride layer is arranged between the sidewall and the dielectric layer; and
    reducing a height of the nitride layer to correspond to a level of the at least one trench,
    wherein the reducing the height is performed before the removing the at least one dummy gate.

13. The method of claim 10, further comprising:
    forming a nitride layer on a sidewall of the at least one dummy gate, wherein the nitride layer is arranged between the sidewall and the dielectric layer; and
    reducing a height of the nitride layer to correspond to a level of the at least one trench,
    wherein the reducing the height is performed after the removing the at least one dummy gate.

14. The method of claim 10, wherein:
    the damascene gate and the local interconnect are formed in the dielectric layer; and
    the damascene gate and the local interconnect are formed by the metal layer.

15. The method of claim 14, further comprising forming a nitride layer between a substrate and the dielectric layer, wherein the nitride layer is also between the damascene gate and the dielectric layer.

16. The method of claim 15, wherein:
    the at least one trench extends through the dielectric layer to the nitride layer; and
    a lowermost surface of the local interconnect contacts the nitride layer.

17. The method of claim 15, wherein:
    the at least one trench extends through the dielectric layer and the nitride layer; and
    a lowermost surface of the local interconnect contacts an isolation structure formed in the substrate.

18. The method of claim 10, wherein the local interconnect contacts the damascene gate.

19. The method of claim 1, wherein the local interconnect contacts the damascene gate.

20. The method of claim 1, wherein the removing step exposes the upper surface of the gate dielectric.

21. The method of claim 20, wherein the gate dielectric which was exposed during the removing step remains on the upper surface of the substrate during the removing step.

22. The method of claim 21, wherein the trench extends only partially into the ILD layer.

23. The method of claim 22, wherein the forming the metal layer comprises a single metal deposition step to form a single metal layer.

24. The method of claim 23, wherein the single metal layer is formed directly on the upper surface of the gate dielectric and within the trench.

25. The method of claim 24, wherein the single metal layer undergoes a chemical mechanical polishing process to planarize the single metal layer with a surface of the ILD.

26. The method of claim 25, wherein the single metal layer is formed substantially simultaneously on the upper surface of the gate dielectric and within the trench.

27. The method of claim 10, wherein the second opening extends in an "L" shape from the another portion of the at least one dummy gate.

* * * * *